United States Patent
Chan et al.

(10) Patent No.: US 10,141,260 B1
(45) Date of Patent: Nov. 27, 2018

(54) INTERCONNECTION STRUCTURE AND METHOD FOR FORMING THE SAME

(71) Applicant: TAIWAN SEMICONDUCTOR MANUFACTURING CO., LTD., Hsinchu (TW)

(72) Inventors: Yu-Chen Chan, Taichung (TW); Shin-Yi Yang, New Taipei (TW); Ming-Han Lee, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/605,987

(22) Filed: May 26, 2017

(51) Int. Cl.
| | |
|---|---|
| H01L 23/48 | (2006.01) |
| H01L 23/52 | (2006.01) |
| H01L 23/528 | (2006.01) |
| H01L 21/768 | (2006.01) |
| H01L 23/532 | (2006.01) |

(52) U.S. Cl.
CPC .... *H01L 23/5283* (2013.01); *H01L 21/76802* (2013.01); *H01L 21/76807* (2013.01); *H01L 21/76829* (2013.01); *H01L 21/76832* (2013.01); *H01L 21/76879* (2013.01); *H01L 23/53266* (2013.01); *H01L 23/53295* (2013.01)

(58) Field of Classification Search
CPC .................... H01L 21/76829; H01L 21/76807
USPC ......................................................... 257/774
See application file for complete search history.

(56) References Cited

U.S. PATENT DOCUMENTS

| | | | | |
|---|---|---|---|---|
| 6,607,977 B1* | 8/2003 | Rozbicki | ........... | H01L 21/76805 438/597 |
| 8,432,037 B2* | 4/2013 | Maekawa | ......... | H01L 21/76805 257/750 |
| 2002/0171147 A1* | 11/2002 | Yew | ................... | H01L 21/76801 257/751 |
| 2003/0008497 A1* | 1/2003 | Lin | ...................... | H01L 21/7681 438/637 |
| 2004/0140563 A1* | 7/2004 | Ahn | ................... | H01L 23/53238 257/751 |
| 2005/0255690 A1* | 11/2005 | Chen | ................... | H01L 21/2855 438/627 |
| 2006/0024941 A1* | 2/2006 | Son | ................... | H01L 21/76802 438/597 |

* cited by examiner

*Primary Examiner* — David Vu
*Assistant Examiner* — Brandon Fox
(74) *Attorney, Agent, or Firm* — McClure, Qualey & Rodack, LLP (57) ABSTRACT

A method of forming an interconnection structure includes forming a dielectric structure over a non-insulator structure; forming a hole in the dielectric structure to expose the non-insulator structure; forming a first diffusion barrier layer into the hole in the dielectric structure using a first deposition process; forming a second diffusion barrier layer over the first diffusion barrier layer using a second deposition process that is different from the first deposition process; and forming a metal over the second diffusion barrier layer.

20 Claims, 7 Drawing Sheets

INTERCONNECTION STRUCTURE AND METHOD FOR FORMING THE SAME

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, interconnection of conductive lines and associated dielectric materials that facilitate wiring between the transistors and other devices play a role in IC performance improvement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
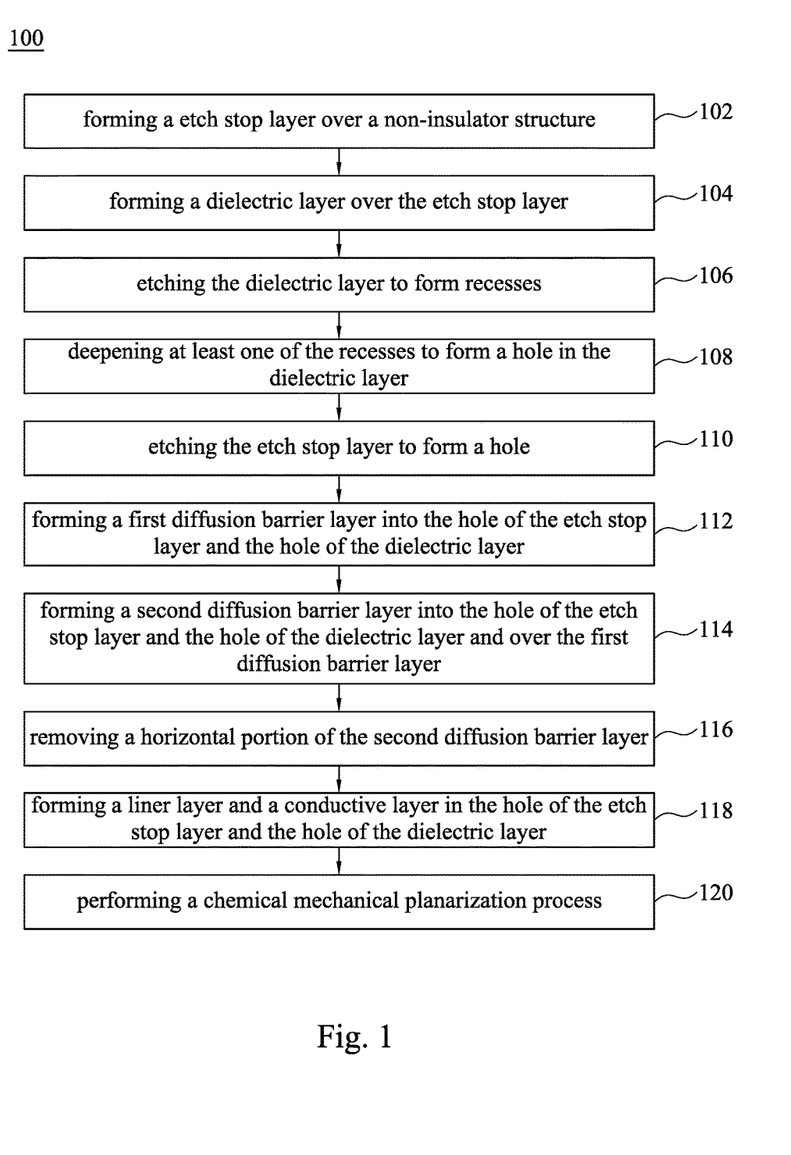
FIG. 1 is a flow chart of a method for forming an interconnection structure according to some embodiments of the present disclosure.

FIG. 1 is a flow chart of a method 100 for forming an interconnection structure according to some embodiments of the present disclosure. FIGS. 2 to 9 are cross-sectional views of intermediate stages in the formation of an interconnection structure according to some embodiments of the present disclosure. Various operations 102 to 120 of the method 100 are discussed in association with FIGS. 2-11.

Figure 2:
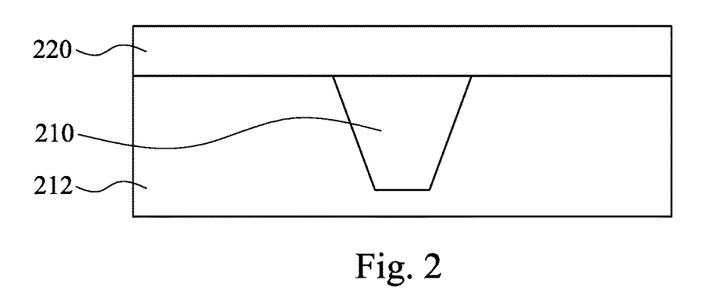
FIGS. 2 to 11 are cross-sectional views of intermediate stages in the formation of an interconnection structure according to some embodiments of the present disclosure.

In operation 102 of method 100 as shown in FIG. 2, an etch stop layer (ESL) 220 is formed over a non-insulator structure 210. Herein, the non-insulator structure 210 is embedded in an insulator structure 212. The insulator structure 212 may be an interlayer dielectric (ILD) layer that includes a dielectric material. The dielectric material may include tetrathoxysilane (TEOS), an extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, parylene, BCB (bis-benzocyclobutenes), polyimide, or any combination thereof. The ELK dielectric material has a dielectric constant less than, for example, about 2.5. It is understood that the insulator structure 212 may include one or more dielectric materials and/or one or more dielectric layers. In some embodiments, the insulator structure 212 may be deposited by chemical vapor deposition (CVD), high density plasma (HDP) CVD, sub-atmospheric CVD (SACVD), spin-on coating, sputtering, or other suitable techniques.

The non-insulator structure 210 refers to a structure formed of one or more non-insulator materials, polysilicon, metal, conductive materials, semiconductor materials or combinations thereof. The non-insulator structure 210 can serve as a conductive line or a conductive via of an interconnect structure, or a gate electrode or a source/drain region of a semiconductor device, such as a fin field effect transistor (FinFET).

In some embodiments, when the non-insulator structure 210 serves as the conductive line or the conductive via of the interconnect structure, the non-insulator structure 210 may include a conductive material such as copper, although other materials, such as tungsten, aluminum, gold, or the like, can alternatively be utilized. In some embodiments in which the non-insulator structure 210 is formed of copper, the non-insulator structure 210 may be deposited by electroplating techniques, although any method of formation can alternatively be used.

In some embodiments, when the non-insulator structure 210 serves as the gate electrode of the FinFET, the non-insulator structure 210 may be formed by a gate last process. An exemplary gate last process may include forming a dummy gate structure including a material, such as polysilicon, on a semiconductor fin, forming spacers including a material, such as silicon oxide, silicon nitride, silicon oxynitride, silicon carbide, beside the dummy gate structure, removing the dummy gate structure to form a trench between the spacers, and forming at least one metal layer into the trench between the spacers to from the non-insulator structure 210. The metal layer may include a metal material suitable for forming the gate electrode or a portion thereof, including, work function layers, liner layers, interface layers, seed layers, adhesion layers, barrier layers and so on. In some embodiments, the metal layer may include suitable metal, such as TiN, WN, TaN, or Ru, which performs in a p-type FinFET. In some alternative embodiments, the metal layer may include suitable metal, such as Ti, Ag, Al, TiAl, TiAlN, TiAlC, TiAlCN, TaC, TaCN, TaSiN, Mn, or Zr, which performs in an n-type FinFET.

In some embodiments, when the non-insulator structure 210 serves as the source/drain region, an exemplary formation process may include doping an n-type dopant, such as phosphorous, or a p-type dopant, such as boron, into at least one portion of the semiconductor fin not covered by the spacers and the gate electrode by using ion implantation. Another exemplary process of forming the source/drain region may include forming at least one source/drain recess in the fin adjacent to the spacer, forming a seed layer in the source/drain recess, forming a relaxed epitaxial layer on the seed layer in the source/drain recess, forming an epitaxial layer on the relaxed epitaxial layer in the source/drain recess, so that the seed layer, the relaxed epitaxial layer and the epitaxial layer form a source/drain stressor to serve as the source/drain region. In some embodiments, the source/drain stressor includes, for example, SiP, SiP or SiCP, which is able to induce a tensile strain to the n-type channel in the semiconductor fin. In some other embodiments, the source/drain stressor includes SiGe, which is able to induce a compressive strain to the p-type channel in the semiconductor fin.

The etch stop layer 220 may protect the non-insulator structure 210 and the insulator structure 212 during an etching process of forming a via opening, an etching process of forming a trench opening or both of them. In some embodiments, the etch stop layer 220 may include a dielectric material, such as silicon carbide, silicon nitride or carbon-doped silicon nitride. In some embodiments, the etch stop layer 220 may include a conductive material, such as Ti, TiN, TiC, TiCN, Ta, TaN, TaC, TaCN, W, WN, WC, WCN, TiAl, TiAlN, TiAlC, or TiAlCN. In some embodiments, the etch stop layer 220 may be deposited using chemical vapor deposition (CVD), high density plasma (HDP) CVD, sub-atmospheric CVD (SACVD), molecular layer deposition (MLD), sputtering, physical vapor deposition (PVD), plating, or other suitable techniques. For example, in some embodiments, the MLD process is carried out under a pressure less than about 10 mTorr and in the temperature range from about 350° C. to about 500° C. In some embodiments, the silicon nitride is deposited on the top surface of the non-insulator structure 210 by reacting a silicon source compound and a nitrogen source. The silicon source compound provides silicon to the deposited silicon nitride and may include silane ($SiH_4$) or tetrathoxysilane (TEOS). The nitrogen source provides nitrogen to the deposited silicon nitride and may include ammonia ($NH_3$) or nitrogen gas ($N_2$). In some other embodiments, the carbon-doped silicon nitride is deposited on the top surface of the non-insulator structure 210 by reacting a carbon source compound, a silicon source compound, and a nitrogen source. The carbon source compound may include an organic compound, such as a hydrocarbon compound, e.g., ethylene ($C_2H_6$).

Figure 3:
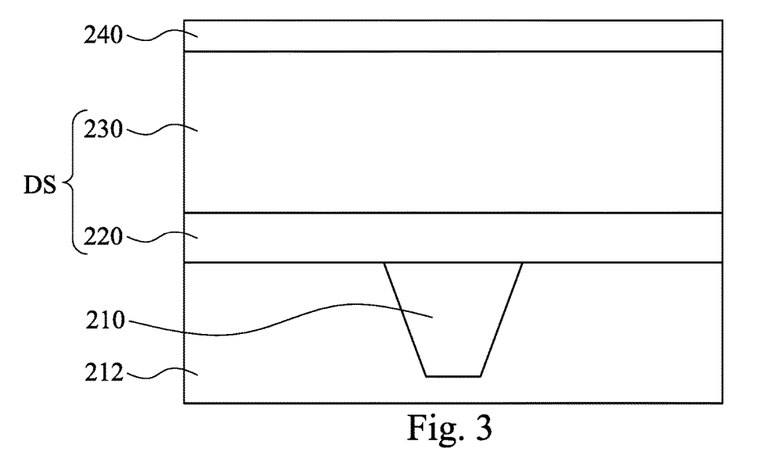

In operation 104 of method 100 as shown in FIG. 3, a dielectric layer 230 is formed over the etch stop layer 220. In other words, the etch stop layer 220 is present between the dielectric layer 230 and the non-insulator structure 210. The dielectric layer 230 may be an interlayer dielectric (ILD) layer that includes a dielectric material. The dielectric material may include tetrathoxysilane (TEOS), an extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, Parylene, BCB (bis-benzocyclobutenes), polyimide, or any combination thereof. The ELK dielectric material has a dielectric constant less than, for example, about 2.5. It is understood that the dielectric layer 230 may include one or more dielectric materials and/or one or more dielectric layers. In some embodiments, the dielectric layer 230 may be deposited on the etch stop layer 220 by CVD, HDP CVD, SACVD, spin-on, sputtering, or other suitable techniques. The etch stop layer 220 and the dielectric layer 230 can be in combination referred to as a dielectric structure DS over the non-insulator structure 210.

Then, an anti-reflection layer 240 is optionally formed over the dielectric structure DS. The anti-reflection layer 240 may be formed of a nitride material, an organic material, an oxide material and the like. The anti-reflection layer 240 may be formed by using suitable techniques, such as CVD. In alternative embodiments, the anti-reflection layer 240 may be omitted.

Figure 4:
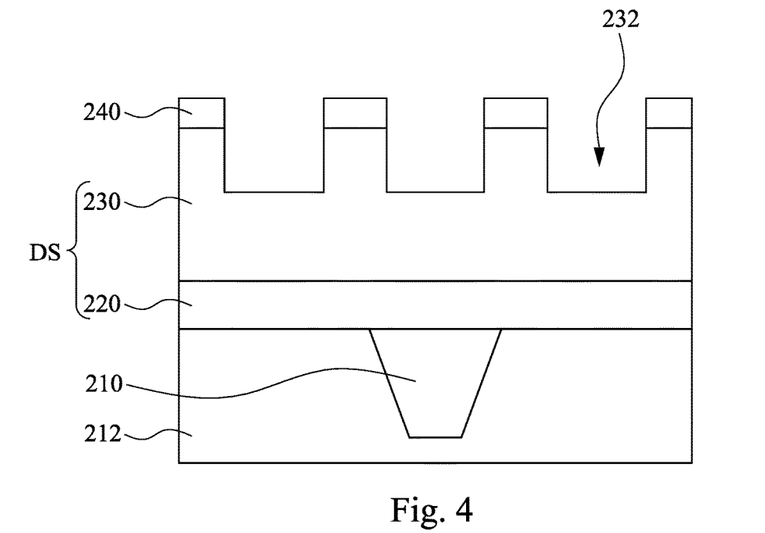

In operation 106 of method 100 as shown in FIG. 4, an etching process is performed to the dielectric layer 230 to form recesses 232 therein, in which the etch stop layer 220 is not exposed in the recess 232. To be specific, portions of the anti-reflection layer 240 and the dielectric layer 230 are removed, so as to form the recesses 232 in the dielectric layer 230. In some embodiments, the dielectric layer 230 is recessed until reaching a level above the etch stop layer 220. Stated differently, the etching process does not etch through the dielectric layer 230 to expose the etch stop layer 220. An exemplary formation process of the recess 232 is described as follows.

A photoresist layer (not shown) may be formed over the anti-reflection layer 240 and then patterned to form a photoresist mask with the image of the recess 232. Using the photoresist layer as a mask, the pattern of the recess 232 is then etched into the dielectric layer 230. After the etching process, the photoresist mask is removed by, for example, oxygen plasma ashing. The etching process of forming the recess 232 is stopped before the etch stop layer 220 is exposed, so that a portion of the dielectric layer 230 remains between the recess 232 and the etch stop layer 220 at this step. In some embodiments, the etching process may be a dry etching, wet etching and/or plasma etching process. For example, the etching process of forming the recess 232 may employ a mixture of tetrafluoromethane ($CF_4$), trifluoromethane ($CHF_3$) and oxygen as the etching gases.

Figure 5:
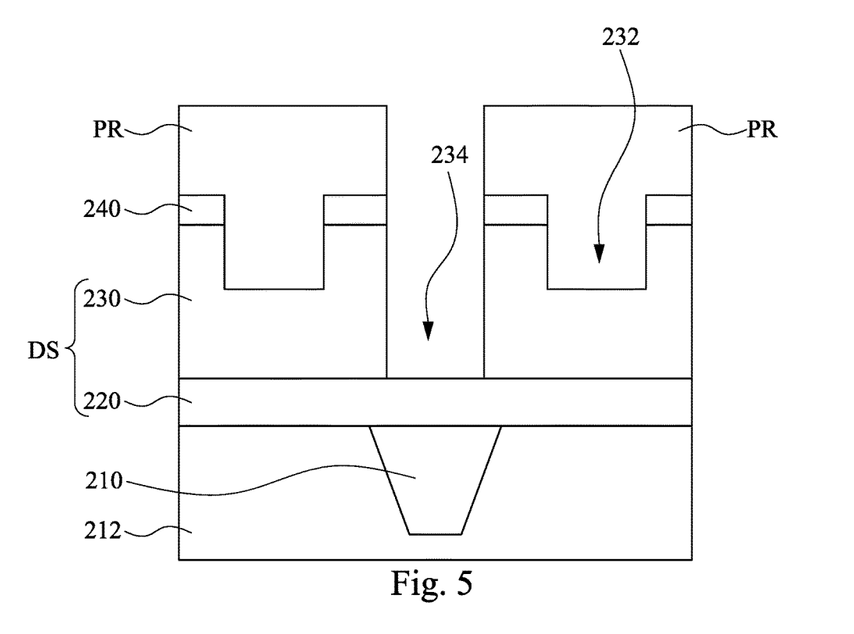

In operation 108 of method 100 as shown in FIG. 5, an etching process is performed to deepen at least one of the recesses 232 over the non-insulator structure 210, so that a hole 234 is formed in the dielectric layer 230 and over the non-insulator structure 210. Other recesses 232 can be protected using a suitable mask, such as a photoresist mask PR, during this etching process. The etch stop layer 220 is exposed at a bottom of the hole 234. In a greater detail, a portion of the dielectric layer 230 underlying the recess 232 in FIG. 4 is removed to form the hole 234 that exposes the etch stop layer 220. In other words, the recess 232 is deepened until reaching the etch stop layer 220. The removal process can be an etching process, such as, an anisotropic etching process. The anisotropic etching process can be, for example, a $CF_4$ based or octafluorocyclobutane ($C_4F_8$) based dry etching process.

In some embodiments, the etch stop layer 220 and the dielectric layer 230 have different etch resistance properties. An etch resistance of the etch stop layer 220 to an etchant used in the removing the portion of the dielectric layer 230 may be greater than that of the dielectric layer 230. Therefore, the etching process is slowed down or stopped by the etch stop layer 220.

Figure 6:
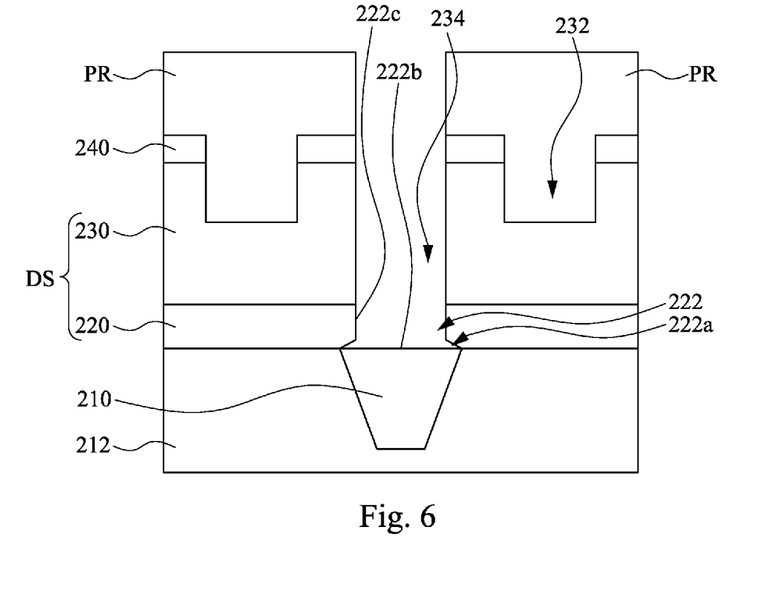

In operation 110 of method 100 as shown in FIG. 6, a portion of the etch stop layer 220 underlying the hole 234 is removed to form an hole 222 using an etching process, which allows non-insulator structure 210 to be exposed. The etching process may be a wet etching, a dry etching or combinations thereof. The hole 222 of the etch stop layer 220 is in communication with the hole 234 of the dielectric layer 230, and the hole 222 of the etch stop layer 220 and the hole 234 of the dielectric layer 230 can be in combination referred to as a hole of the dielectric structure DS. After the etching process, a cleaning operation is performed to remove byproducts or residues remained in the hole of the dielectric structure DS. In some embodiments, the etching and/or the cleaning operations may lead to lateral etching of portions of the etch stop layer 220, such that lateral recesses 222a are formed in sidewalls 222c of the hole 222 of the etch stop layer 220.

Figure 7:
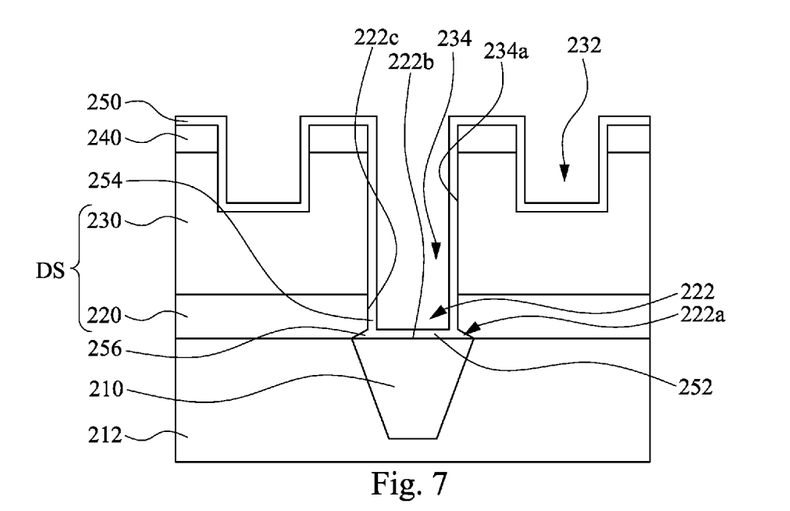

In operation 112 of method 100 as shown in FIG. 7, after the photoresist mask PR is removed, a first diffusion barrier layer 250 is blanket formed over the dielectric layer 230. Herein, the first diffusion barrier layer 250 is formed on the exposed surface of the non-insulator structure 210 and formed into the hole 222 of etch stop layer 220, the recesses 232 and the hole 234 of the dielectric layer 230. The first diffusion barrier layer 250 covers the exposed surface of the non-insulator structure 210. Because of the covering, the oxidation occurring on the exposed surface of the non-insulator structure 210 is avoided. Due to the low reactivity with oxygen for the first diffusion barrier layer 250, oxidation occurring on the surface of the first diffusion barrier layer 250 is less serious. The first diffusion barrier layer 250 can be a metal film which is less reactive to oxygen than the non-insulator structure 210. The first diffusion barrier layer 250 can be a film such as TiN, CrN, TaN, HfN, NbN, ZrN, VN, MnN, WN, CuSix, amorphous carbon, graphene, or a combination film thereof.

In some embodiments, the first diffusion barrier layer 250 is formed by a deposition process without ion bombardment, such that the non-insulator structure 210 and the insulator structure 212 do not experience a high-energy particle bombardment during the deposition of the first diffusion barrier layer 250. In some embodiments, the method of forming the first diffusion barrier layer 250 may include a conformal deposition process without ion bombardment, such as a chemical vapor deposition (CVD) process, an atomic layer deposition (ALD) process or a combination thereof, instead of a non-conformal deposition process, such as a physical vapor deposition (PVD). ALD is a gas phase chemical process and it is a self-limiting atomic layer-by-layer growth method. The surface-controlled growth mechanism of ALD provides good step coverage and dense films with few (or no) pinholes. Therefore, the first diffusion barrier layer 250 is formed without an overhang, in which the overhang is a projection or extension of the deposited layer 250 that extends over the hole 234 and is unfavorable for shrinkage of the semiconductor device. The precision achieved with ALD allows processing of extremely thin films in a controlled way in the nanometer scale. For example, the first diffusion barrier layer 250 is formed to be from about 5 angstroms to about 100 angstroms.

In some embodiments, the first diffusion barrier layer 250 covers the bottom 222b and the sidewalls 222c. Due to the conformal deposition, the first diffusion barrier layer 250 is formed into the lateral recesses 222a, thereby improving the reliability performance and increasing a contact area between the non-insulator structure 210 and the first diffusion barrier layer 250. To be specific, the first diffusion barrier layer 250 has a horizontal portion 252, vertical portions 254, and bottom ledge portions 256. The horizontal portion 252 of the first diffusion barrier layer 250 is at the bottom 222b of the hole 222, the vertical portions 254 of the first diffusion barrier layer 250 are on the sidewalls 222c of the hole 222, and the bottom ledge portions 256 of the first diffusion barrier layer 250 extend into and fill the lateral recesses 222a. In some embodiments, the vertical portions 254 of the first diffusion barrier layer 250 extend onto the sidewalls 234a of the hole 234.

Figure 8:
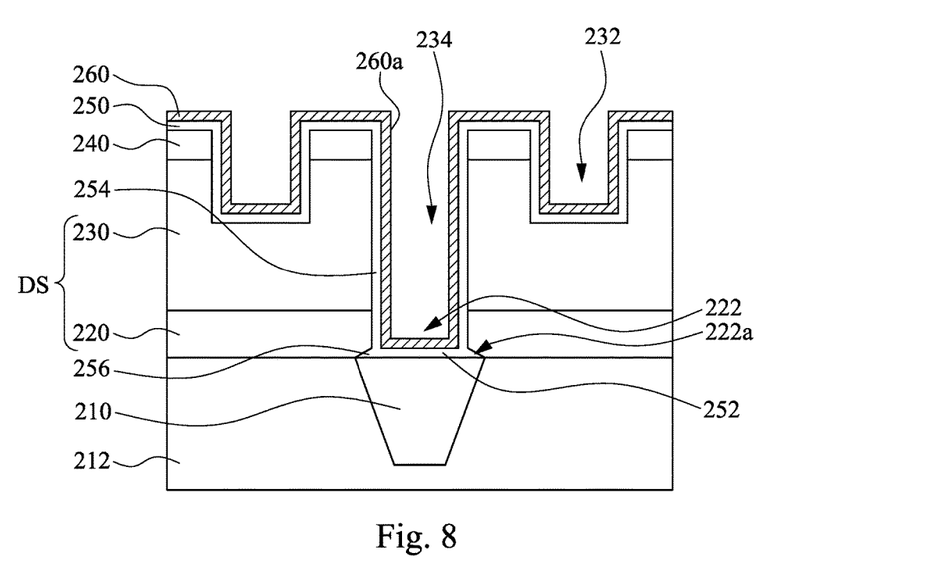

In operation 114 of method 100 in accordance with FIG. 8, a second diffusion barrier layer 260 is blanket formed over the first diffusion barrier layer 250. For example, the second diffusion barrier layer 260 is formed into the hole 222 of etch stop layer 220, the recess 232 and the hole 234 of the dielectric layer 230 and over the first diffusion barrier layer 250. In some embodiments of the present disclosure, the first diffusion barrier layer 250 and the second diffusion barrier layer 260 conduct electricity and prevent inter-diffusion and reaction between metals, silicon or dielectric materials. A deposition process forming the second diffusion barrier layer 260 is different from the deposition process forming the first diffusion barrier layer 260. For example, the second diffusion barrier layer 260 is formed by a deposition process including ion bombardment that is not included in depositing the first diffusion barrier layer 250. Ion bombardment is beneficial in reducing an overhang of the second diffusion barrier layer 260, in which the overhang is a projection or extension of the deposited layer 260 that extends over the hole 234. Moreover, ion bombardment is also beneficial in reducing a thickness of the deposited layer 260, and hence a contact resistance between the non-insulator structure 210 and the subsequently formed metal in the hole 234 can be reduced. In some embodiments, the deposition process including ion bombardment is a non-conformal deposition process, such as a PVD process. Although the non-conformal process may exacerbate the overhang of the deposited layer 260, the overhang can be diminished by the ion bombardment during the deposition.

Specifically, PVD is a deposition method which involves physical processes such as a plasma sputter bombardment rather than involving a chemical reaction at the surface. In the plasma sputter process, atoms or molecules are ejected from a target material by high-energy particle bombardment so that the ejected atoms or molecules can condense on a substrate as a thin film. The deposition method may also impact the underlaying material. As an example, if a barrier is directly deposited on top of the non-insulator structure 210 and the insulator structure 212 by a PVD method, the non-insulator structure 210 and the insulator structure 212 would be exposed to high-energy particle bombardment (plasma damage). The non-insulator structure 210 and the insulator structure 212 would suffer the plasma damage during sputtering, which may degrade the reliability of the non-insulator structure 210 and the insulator structure 212.

In some embodiments of the present embodiments, because of the presence of the first diffusion barrier layer 250, when the second diffusion barrier layer 260 is formed by the deposition process including strong ion bombardment, the first diffusion barrier layer 250 can protect the underlying non-insulator structure 210 and the insulator structure 212 from the ion bombardment. As a result, the reliability of the non-insulator structure 210 and the insulator structure 212 may remain. Furthermore, because of the strong ion bombardment, the second diffusion barrier layer 260 has vertical sidewalls 260a in the recess 232 and the hole 234 of the dielectric layer 230 without an overhang. In some embodiments, a thickness of the second diffusion barrier layer 260 may be reduced by the ion bombardment. For example, the thickness of the second diffusion barrier layer 260 may be less than a thickness of the first diffusion barrier layer 250. For example, a thickness of the second diffusion barrier layer 260 is less than 40 angstroms. The power used in ion bombardment in depositing the non-conformal second diffusion barrier layer 260 ranges from 50 Watt to 10000 Watt, as examples.

In some embodiments, an adhesion between the second diffusion barrier layer 260 and a subsequently formed metal in the hole 222 or the hole 234 is higher than an adhesion between the first diffusion barrier layer 250 and the subsequently formed metal. Therefore, the second diffusion barrier layer 260 can improve the adhesion to the metal. For example, the materials of the second diffusion barrier layer 260 can be TiN, CrN, TaN, HfN, NbN, ZrN, VN, MnN, WN, $CuSi_x$. In some embodiments, since the lateral recess 222a is filled with the conformal first diffusion barrier layer 250, the non-conformal second diffusion barrier layer 260 does not extend into the lateral recess 222a.

Figure 9:
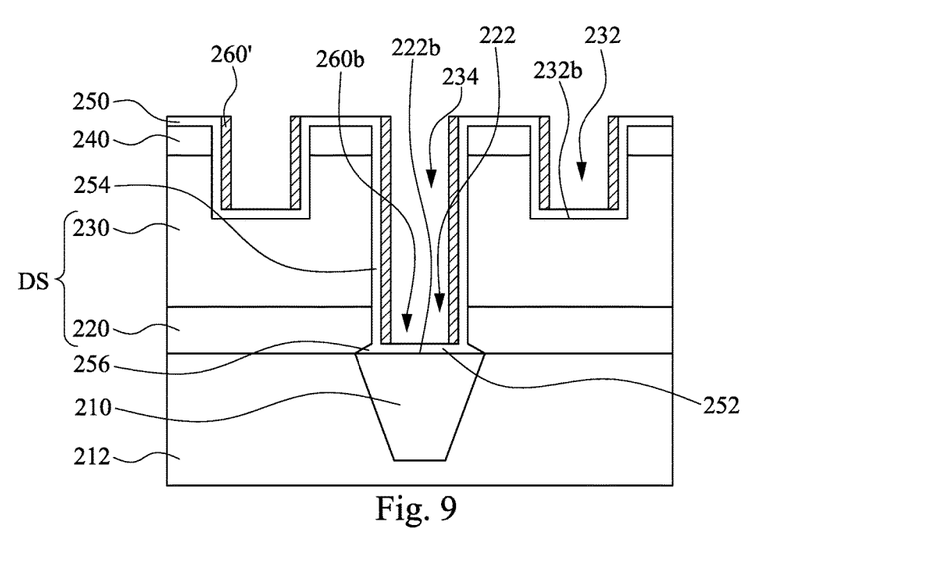

In operation 116 of method 100 in accordance with FIG. 9, horizontal portions of the second diffusion barrier layer 260 on the bottom 222b of the hole 222 and the bottom 232b of the recesses 232 are removed, while vertical portions of the second diffusion barrier layer 260 (i.e., the second diffusion barrier layer 260') remain on sidewalls of the hole 222, sidewalls of the hole 234, and sidewalls of the recesses 232. Herein, a anisotropic etching process are performed to remove the portion of the second diffusion barrier layer 260 on the bottom 222b of the hole 222 and the bottom 232b of the recesses 232. The anisotropic etching process can be reactive ion etch (RIE) with various plasma sources including inductively coupled plasma (ICP) and electron cyclotron resonance (ECR). An etchant in the anisotropic etching process can be $CF_x$, $CHF_x$, $CH_x$, $COx$, $Cl_2$, $SF_x$, HCl, HBr, HI, $BCl_x$, $O_2$, $N_2$, $H_2$, Ar, or the combination thereof. Due to non-isotropic characteristic of etching, the anisotropic etching process removes horizontal portions of the second diffusion barrier layer 260, and the remaining second diffusion barrier layer 260' has an opening 260b to expose the horizontal portion 252 of the first diffusion barrier layer 250. The vertical portions 254 of the first diffusion barrier layer 250 remain covered by the remaining second diffusion barrier layer 260'. During the anisotropic etching process, the first diffusion barrier layer 250 acts as a protective layer to protect underlying layers against the etching process. For example, an etch resistance of the first diffusion barrier layer 250 to an etchant used in the anisotropic etching process is greater than that of the second diffusion barrier layer 260.

Figure 10:
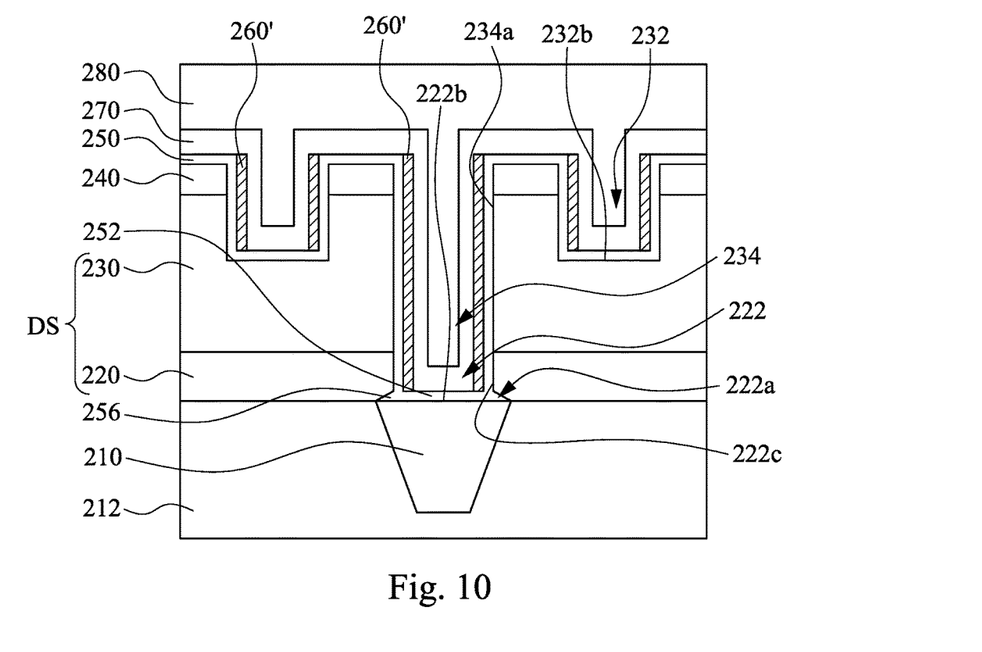

In operation 118 of method 100 in accordance with FIG. 10, a liner layer 270 is blanket formed over the structure in FIG. 9. The liner layer 270 can be a conductive layer such as Ta, TaN, W, WN, Ti, TiN, or a combination film thereof. The liner layer 270 may be formed by, for example, a physical vapor deposition (PVD) processing step, a CVD processing step, an atomic layer deposition (ALD) processing step, a chemical electroplating step, a chemical electroless plating step, or various combinations thereof. A conductive layer 280 is then formed over the liner layer 270. The conductive layer 280 fills the hole 222, the hole 234, and the recesses 232. The conductive layer 280 can be a metal, such as aluminum, aluminum copper or copper. The conductive layer 280 may be formed, for example, by PVD, CVD, ALD, electroplating (ECP) step, a chemical electroless deposition (ELD), or various combinations thereof.

Figure 11:
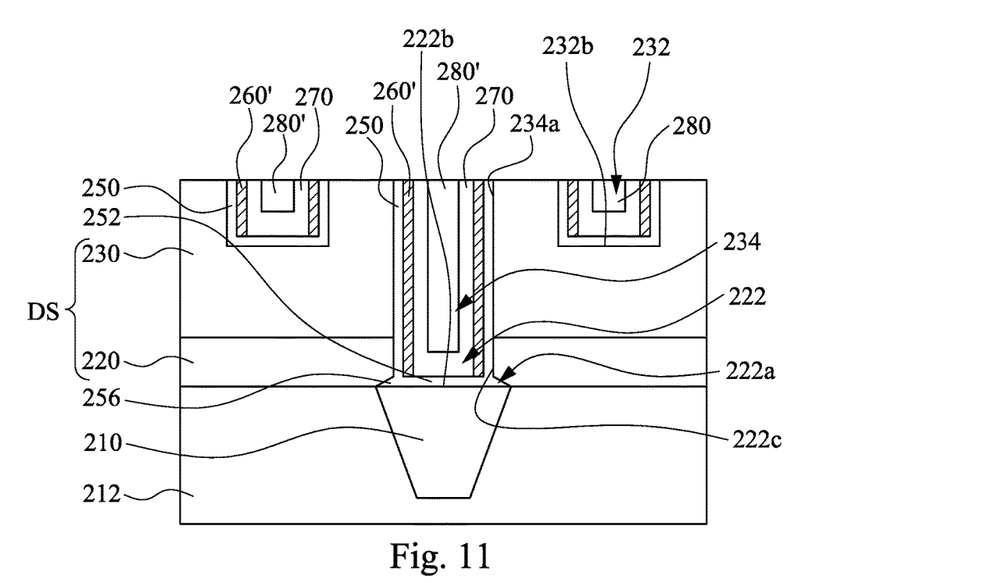

In operation 120 of method 100 as shown in FIG. 11, a chemical-mechanical planarization may be optionally performed later to remove excess material outside the hole of the dielectric structure DS. To be specific, an excess portion of the conductive layer 280 (referring to FIG. 10) outside the hole 234 and the recesses 232 of the dielectric layer 230 is removed, and the remaining conductive layer, referred to as conductive features 280', is left in the hole 234 and the recesses 232 of the dielectric layer 230. Also, the anti-reflection layer 240, an excess portion of the first diffusion barrier layer 250, an excess portion of the second diffusion barrier layer 260, and an excess portion of the liner layer 270 outside the hole 234 and the recesses 232 of the dielectric layer 230 are removed. Through the configuration, at least one of the conductive features 280' is electrically connected to the non-insulator structure 210 through the horizontal portion 252 of the first diffusion barrier layer 250, and the second diffusion barrier layer 260' is not between the horizontal portion 252 of the first diffusion barrier layer 250 and the conductive feature 280'.

Figure 12:
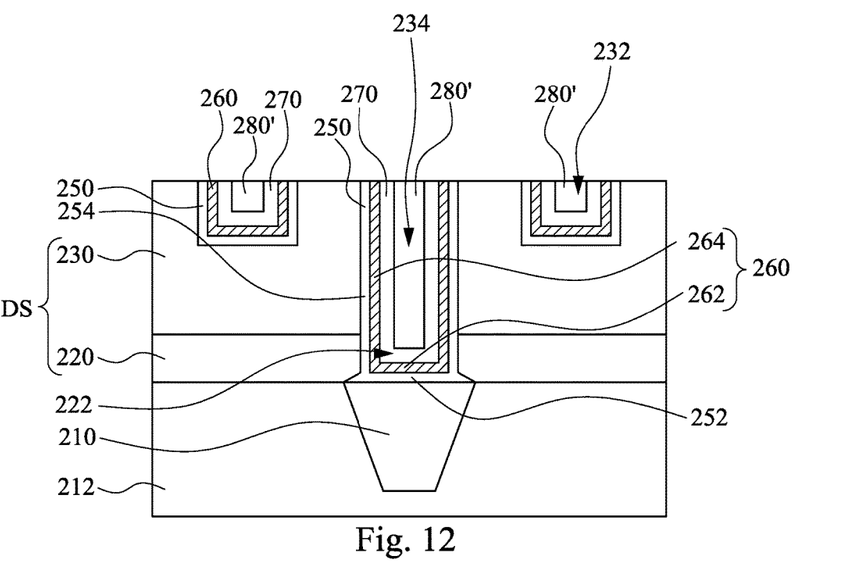
FIG. 12 is a cross-sectional view of an intermediate stage in the formation of an interconnection structure according to some embodiments of the present disclosure.

FIG. 12 is a cross-sectional view of an intermediate stage in the formation of an interconnection structure according to some embodiments of the present disclosure. In some embodiments, the operation 116 of the method 100 in FIG. 1, which is illustrated with FIG. 9, can be omitted. That is, horizontal portions of the second diffusion barrier layer 260 are not removed. Herein, the second diffusion barrier layer 260 remains covering the vertical portions 254 and the horizontal portion 252 of the first diffusion barrier layer 250. For example, the second diffusion barrier layer 260 has a vertical portion 264 between the vertical portion 254 of the first diffusion barrier layer 250 and the conductive feature 280' and a horizontal portion 262 between the horizontal portion 252 of the first diffusion barrier layer 250 and the conductive feature 280'. Through the configuration, at least one of the conductive features 280' is electrically connected to the non-insulator structure 210 through the horizontal portion 252 of the first diffusion barrier layer 250 and the horizontal portion 262 of the second diffusion barrier layer 260.

Based on the above discussions, it can be seen that the present disclosure offers advantages over interconnection structures. It is understood, however, that other embodiments may offer additional advantages, and not all advantages are necessarily disclosed herein, and that no particular advantage is required for all embodiments. One advantage is that the first diffusion barrier layer can protect underlying metals and dielectrics against ion bombardment of forming the second diffusion barrier layer. Another advantage is that the ion bombardment of forming the second diffusion barrier layer can be strong because the underlying metals and dielectrics are protected. Yet another advantage is that the strong ion bombardment is beneficial in reducing an overhang of the second diffusion barrier layer. Yet another advantage is that the strong ion bombardment is beneficial in reducing the thickness of the second diffusion barrier layer, so that the contact resistance can be reduced.

According to some embodiments of the present disclosure, a method of forming an interconnection structure includes forming a dielectric structure over a non-insulator structure; forming a hole in the dielectric structure to expose the non-insulator structure; forming a first diffusion barrier layer into the hole in the dielectric structure using a first deposition process; forming a second diffusion barrier layer over the first diffusion barrier layer using a second deposition process that is different from the first deposition process; and forming a metal over the second diffusion barrier layer.

According to some embodiments of the present disclosure, a method of forming an interconnection structure includes forming a dielectric structure over a non-insulator structure; forming a hole in the dielectric structure to expose the non-insulator structure; forming a first diffusion barrier layer into the hole in the dielectric structure without ion bombardment; forming a second diffusion barrier layer over the first diffusion barrier layer using a deposition process comprising ion bombardment; and forming a conductive feature over the second diffusion barrier layer.

According to some embodiments of the present disclosure, an interconnection structure includes a non-insulator structure, a dielectric structure, a first diffusion barrier, and a metal. The dielectric structure is over the non-insulator structure. The first diffusion barrier is over the non-insulator structure and surrounded by the dielectric structure, the first diffusion barrier having a first portion embedded in a sidewall of the dielectric structure. The metal is over the first diffusion barrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an interconnection structure, comprising:
   forming a dielectric structure over a non-insulator structure;
   forming a hole in the dielectric structure to expose the non-insulator structure;
   forming a first diffusion barrier layer into the hole in the dielectric structure using a first deposition process;
   forming a second diffusion barrier layer over the first diffusion barrier layer using a second deposition process that is different from the first deposition process;
   removing a first portion of the second diffusion barrier layer from a bottom of the hole; and
   forming a metal over the first diffusion barrier layer.

2. The method of claim 1, wherein the forming the hole forms a lateral recess in a sidewall of the dielectric structure, and wherein the first diffusion barrier layer is formed into the lateral recess.

3. The method of claim 2, wherein the lateral recess in the sidewall of the dielectric structure is filled with the first diffusion barrier layer.

4. The method of claim 2, wherein the second diffusion barrier layer does not extend into the lateral recess in the sidewall of the dielectric structure.

5. The method of claim 1, wherein the first diffusion barrier layer is formed without an overhang.

6. The method of claim 1, wherein the second diffusion barrier layer is formed without an overhang.

7. The method of claim 1, wherein the second diffusion barrier layer has higher adhesion to the metal than that of the first diffusion barrier layer.

8. The method of claim 1, wherein the first diffusion barrier layer and the second diffusion barrier layer are formed with different contours.

9. The method of claim 1,
   wherein a second portion of the second diffusion barrier layer remains on a sidewall of the hole after removing the first portion of the second diffusion barrier layer.

10. The method of claim 9, wherein the first diffusion barrier layer has higher etch resistance to an etchant used in the removing than that of the second diffusion barrier layer.

11. A method of forming an interconnection structure, comprising:
    forming a dielectric structure over a non-insulator structure;
    forming a hole in the dielectric structure to expose the non-insulator structure;
    forming a first diffusion barrier layer into the hole in the dielectric structure without ion bombardment;
    forming a second diffusion barrier layer over the first diffusion barrier layer using a deposition process comprising ion bombardment;
    etching the second diffusion barrier layer; and
    forming a conductive feature over the etched second diffusion barrier layer.

12. The method of claim 11, wherein the deposition process comprising ion bombardment is a non-conformal deposition process.

13. The method of claim 11, wherein the forming the first diffusion barrier layer comprises a conformal deposition process.

14. The method of claim 11, wherein the deposition process comprising ion bombardment is a physical vapor deposition process.

15. The method of claim 11, wherein the forming the first diffusion barrier layer comprises a chemical vapor deposition process or an atomic layer deposition process.

16. The method of claim 11, wherein etching the second diffusion barrier layer comprises performing an anisotropic etching process to the second diffusion barrier layer.

17. The method of claim 16, wherein the first diffusion barrier layer has higher etch resistance to the anisotropic etching process than that of the second diffusion barrier layer.

18. An interconnection structure, comprising:
    a non-insulator structure;
    a dielectric structure over the non-insulator structure;
    a metal over the non-insulator structure; and
    a first diffusion barrier having a first portion between a bottom of the metal and the non-insulator structure, a second portion between a sidewall of the metal and the dielectric structure, and a protrusion protruding from an outer sidewall of the second portion and in contact with the non-insulator structure.

19. The interconnection structure of claim 18, further comprising:
    a second diffusion barrier between the first diffusion barrier and the metal, the second diffusion barrier has higher adhesion to the metal than that of the first diffusion barrier.

20. The interconnection structure of claim 19, wherein the first diffusion barrier has a second portion between the non-insulator structure and the metal, and the second diffusion barrier is not between the second portion and the metal.

* * * * *